United States Patent [19]

Kinbara

[11] 4,129,830
[45] Dec. 12, 1978

[54] COUNTING PROCESS FOR TIME-TO-DIGITAL CONVERTING CIRCUITS

[75] Inventor: Setsuro Kinbara, Mito, Japan

[73] Assignee: Japan Atomic Energy Research Institute, Tokyo, Japan

[21] Appl. No.: 800,474

[22] Filed: May 25, 1977

[30] Foreign Application Priority Data

Jun. 28, 1976 [JP] Japan .................................. 51-76148
Sep. 7, 1976 [JP] Japan .................................. 51-106263

[51] Int. Cl.² ............................................. G04F 8/00
[52] U.S. Cl. ..................................... 324/186; 324/181; 324/188
[58] Field of Search ................... 324/186, 78 D, 78 Z, 324/187, 188, 181

[56] References Cited

U.S. PATENT DOCUMENTS 3,524,131  8/1970  McWaid .......................... 324/18 G Primary Examiner—M. Tokar
Attorney, Agent, or Firm—Oblon, Fisher, Spivak, McClelland & Maier

[57] ABSTRACT

A phase that a scaler is operated by gated clock-pulses is made different from another phase that the scaler is operated by the gated clock-pulses at every conversion cycle. The phases in which the operation of the scaler interferes with the clock-pulses and gate circuits are varied at random so that the interfering action is dispersed and an averaging action is obtained.

2 Claims, 8 Drawing Figures

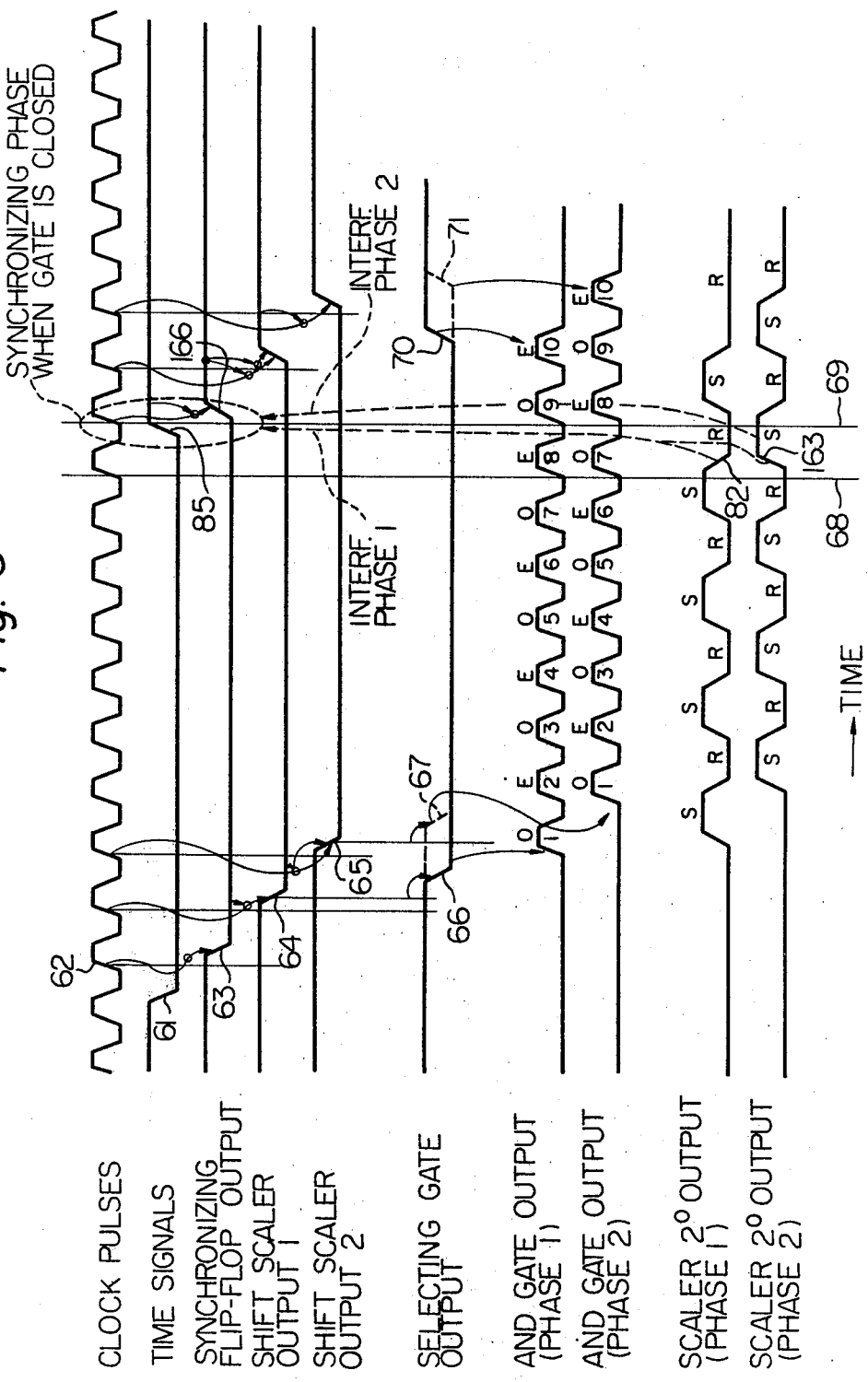

COUNTING PROCESS FOR TIME-TO-DIGITAL CONVERTING CIRCUITS

BACKGROUND OF THE INVENTION

This invention relates to an improvement in a counting process for time-to-digital converting (TDC) circuits used in analog-to-digital converter (ADC) of pulse-height analyzers or time analyzers, and, more particularly, to a counting process for TDC circuits wherein a variation is provided at every conversion cycle between the phases that a scaler is operated by gated clock-pulses. The "scaler" means a scaling circuit. This scaling circuit is used to count the number of pulse signals which are coming into a circuit. The scaling circuit is widely applied for a precise measurement of frequencies or times. A typical example of the scaling circuit is a so-called binary counter circuit or a flip-flop. The interference resulting from the operation of the scaler to the gate circuits and a clock oscillator is eliminated by varying the phases.

In the ADC, digital information is obtained by gating clock-pulses by using time signals and, thereafter, the number of the clock-pulses that are gated is counted over a period where time signals exist. In order to expedite the operation of analysis, high speed clock-pulses are used to accelerate the pulse rate and this results in a tendency to deteriorate the differential non-linearity. Therefore, it is not practically used in the ADC unless the clock rate is extremely limited.

The differential non-linearity is considered to be an important characteristic in pulse-height analyzers etc. and represents the uniformity of analog quantity which is occupied by each digital value.

In a pulse-height analyzers, generally, a histogram is obtained by summing extremely high numbers of values which are obtained from analyses and the analyzers operate to provide finally one output and so an accurate histogram is not obtained unless each digital value assumes theoretically a uniform appearance probability. The differential non-linearity represents the uniformity stated above and the uniformity is an important characteristic in an instrument used for measurement wherein the histogram above stated is obtained. A uniformity at least less than from 1% to 0.5% is required.

The TDC circuits which are employed in the pulse-height analyzers etc. are generally and widely used as one which has, in principle, good differential non-linearity. However, when the pulse rate is accelerated, the operation in the gates becomes incomplete and the operation in the scaler interferes with a clock oscillator or clock gates to provide an odd-even unbalance phenomenon, a 4 channel period unbalance in regularity or an 8 channel period unbalance in regularity and the differential non-linearity is deteriorated with the odd-even unbalance phenomenon left most remarkably. The odd-even unbalance phenomenon is referred to as a phenomenon wherein the digital values are separated into two groups of the odd numbers and the even numbers and unbalance is brought about. The channel is referred to as the digital value itself.

In order to prevent the differential non-linearity which is caused by the unbalance, as stated above, from being deteriorated, the operation of the gate circuits is, in the prior art, made exact as the main countermeasure. In order to make the operation of the gate exact, a synchronizing circuit is generally utilized wherein clock-pulses that are oscillating at an arbitrary phase are gated by time signals incoming at an arbitrary time relation.

An embodiment of the synchronizing gate circuit is shown in FIG. 1. In the figure, clock-pulses generated in a clock oscillator 1 are applied to a gate circuit 3 and, at the same time, time signals coming from an input terminal 2 are also applied to gate circuit 3. The outputs gated at gate circuit 3 are counted at a scaler 4. Gate circuit 3 is comprised of a Type D Flip-Flop (Type D-FF) 5 and an AND gate 9. The time signals are applied to the Type D-FF 5 at a data input terminal (Terminal D) 7 and are synchronized with the clock-pulses applied to the Type D-FF 5 at a clock terminal (Terminal C) 6 to set the Type D-FF 5. The output which is set is obtained at an output terminal (Termianl Q) 8 to gate AND gate 9 by the signals which are obtained through synchronization with the clock-pulses. The clock-pulses coming from clock oscillator 1 are directly applied to one of the input terminals in AND gate 9 and to the other of the input terminals in AND gate 9 are applied the synchronized signals, above stated. According to this construction, the clock-pulses are synchronized with the gate signals in AND gate 9, so the incomplete operation of scaler 4 becomes less and scaler 4 operates exactly.

Further, a gate circuit 17 shown in FIG. 2 may be utilized to double the synchronizing circuit in order to make the synchronizing operation perfect when it is considered that the synchronizing operation is insufficient by the circuit shown in FIG. 1.

The circuit shown in FIG. 1 or FIG. 2 emphasizes the synchronization so that the synchronization can be performed exactly to some extent. However, it is naturally impossible to eliminate fully the incomplete operation of the scaler and the incomplete operation still remains quite slightly.

Further, the odd-even unbalance phenomena, above stated, cannot be improved only by the complete operation of the gate circuit but the following phenomena appear as it is explained in FIG. 3. The $2^0$ order 31 or the $2^1$ order 33 themselves of a scaler 30 and the signals at output terminals 32 and 34 of scaler 30 are derived, from the operation of the $2^0$ order 31 or the $2^1$ order 33, directly or indirectly, at a clock oscillator 25, an output terminal 27 of the clock oscillator, a gate circuit 28, an input terminal 26 for the time signals and an output line 29 of the gate circuit etc. to provide an interference at twice or four times periods of the clock-pulses.

For instance, the interference coming from the first stage $2^0$ order 31 of scaler 30 and from output terminal 32 of the scaler has a period of twice the period of the clock-pulses and the period of the clock-pulses are repeated alternately at a wide period and at a narrow period every each other, according to the phase wherein the interference is superimposed to the clock-pulses. Therefore, when the interference occurs before gate circuit 28, the odd-even unbalance cannot be avoided with whatever exact operation of the gate circuit utilized and with whatever exact synchronization effected.

The defect, above stated, is left unsettled in the prior art circuits and the clock-pulse rate cannot be expedited due to the odd-even unbalance phenomana.

SUMMARY OF THE INVENTION

In this invention, in order to settle the defect, above stated, a variation is provided at every conversion cycle between the phases that the scaler is operated by the gated clock-pulses. The phases in which the operation of the scaler interferes with the clock-pulses and the gate circuits are varied to provide an averaging operation.

As one method to provide the averaging operation, a time difference is provided between the time when the synchronizing operation is performed by the time signals and the time when the clock-pulses are applied to the scaler by the AND gate. The time difference is varied uniformly during an arbitrary time at one period unit of the frequency of the clock-pulses to vary the operational phases of the scaler and, therefore, the defect can be dispersed that is caused as fixed in a specified channel by the interference operation that is brought about from the operation of the scaler.

As the other method to provide the averaging operation, a time difference is provided by means of delay elements between the times the pulse train, that is gated by each of the synchronized time signals, is sent to the scaler to vary the operational phases of the scaler and the interference operation is dispersed.

It is thus aimed that the unbalance phenomena is eliminated by providing the phase variation stated above and that the differential non-linearity is improved.

The object of this invention is, therefore, to provide a counting process for a TDC circuit with fairly good differential non-linearity even when high speed clock-pulses are used and, more particularly, to provide a gate circuit wherein an accurate TDC process is attained with high speed clock-pulses applied.

BRIEF DESCRIPTION OF THE DRAWING

FIG. 5 is a diagram explaining the timing of the operation in the gate circuits shown in FIG. 4 with partially modelled.

DESCRIPTION OF THE PREFERRED EMBODIMENTS

Figure 1:
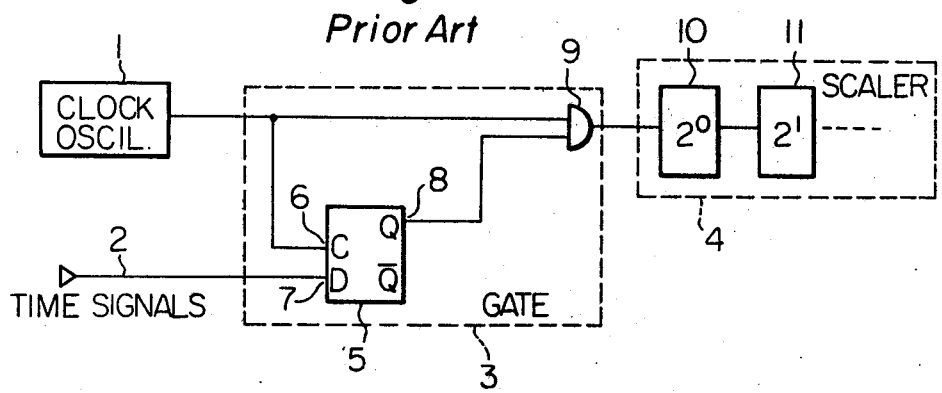
FIG. 1 is a block diagram showing the most fundamental construction of the synchronizing gate circuit in the prior art.
Figure 2:
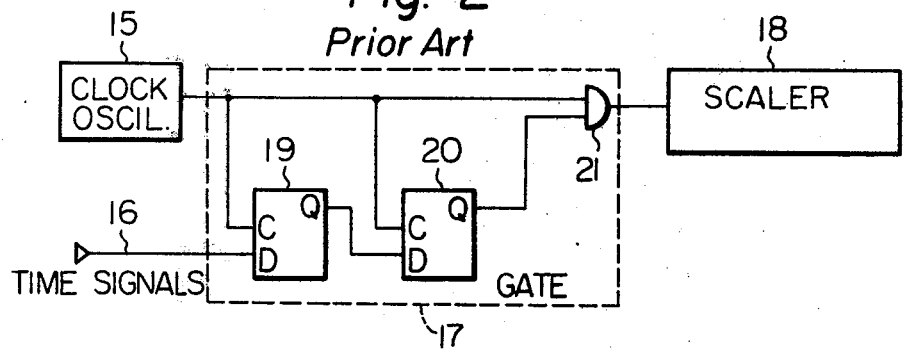
FIG. 2 is a block diagram showing a construction similar to that shown in FIG. 1 with a two-stage synchronizing circuit used in order to make the synchronizing operation perfect.
Figure 3:
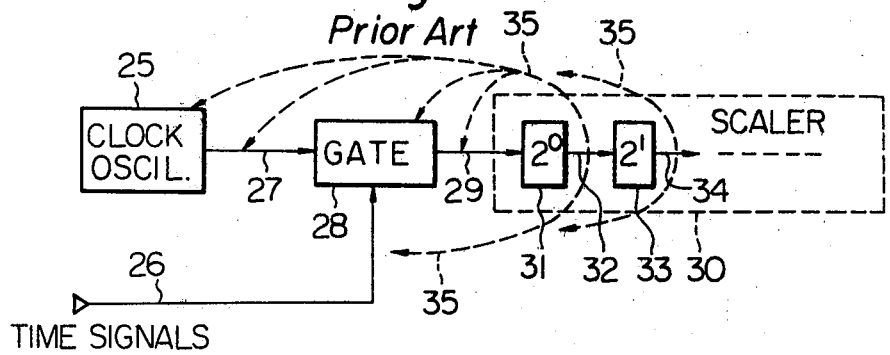
FIG. 3 is a block diagram explaining the status in which the interference operation is applied to a clock oscillator, a gate circuit or time signals too by the operation of a scaler in a TDC circuit.
Figure 4:
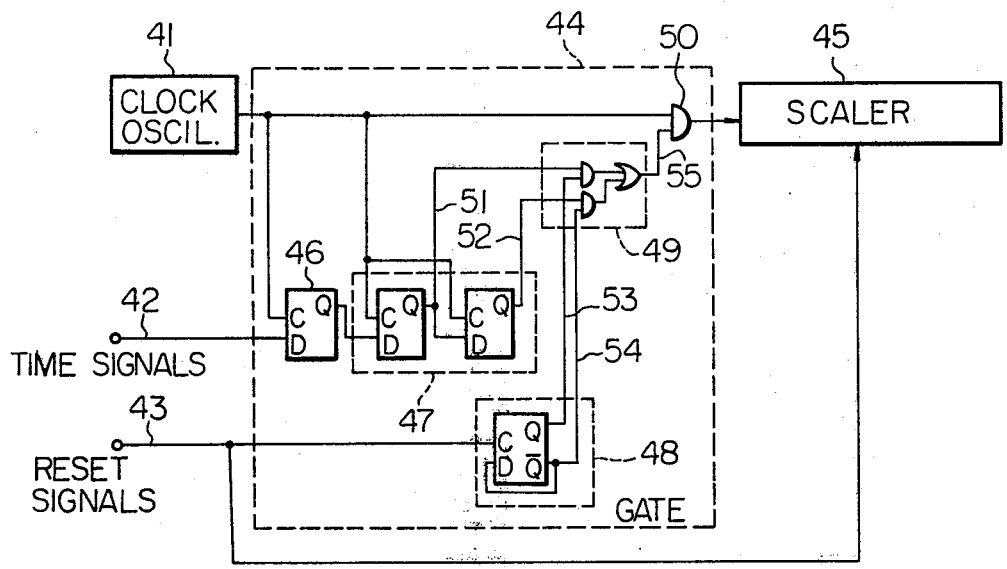
FIG. 4 is a block diagram showing an embodiment in which the gate circuits are provided in accordance with the counting process of this invention.

In FIG. 4 is shown a construction of an embodiment of the counting process of this invention, wherein the output of a clock oscillator 41 is connected to a synchronizing flip-flop (FF) 46, a shift scaler 47 and an AND gate 50, all being in a gate circuit 44. An input terminal 42 used for time signals is connected to synchronizing FF 46 in gate circuit 44 and an input terminal 43 used for reset signals is connected to a phase control circuit 48, also in gate circuit 44. The output signals from shift scaler 47 in gate circuit 44, which has a construction similar to that of the synchronizing FF 46, is connected to a selecting gate 49 in gate circuit 44 via lines 51 and 52 and the selecting signal of phase control circuit 48 in gate circuit 44 is also connected to selecting gate 49 in gate circuit 44 via lines 53 and 54. The output from selecting gate 49 is connected to AND gate 50 in gate circuit 44 via a line 55. The output from AND gate 50 is connected to a scaler 45.

The operation of the circuit shown in FIG. 4 is explained as follows: The clock-pulses coming from clock oscillator 41 are applied to AND gate 50 as well as synchronizing FF 46 with the time signals applied from input terminal 42. The time signals synchronize with the clock-pulses coming from clock oscillator 41 in synchronizing FF 46, are applied to shift scaler 47 and synchronize with the clock-pulses to generate signals which are shifted every each cycle, on lines 51 and 52. The two signals are applied to selecting gate 49 and are selected alternately in the selecting gate by the selecting signals on lines 53 or 54 which are changing with a cycle coming from phase control circuit 48 by the reset signal applied from input terminal 43. Either one signal, thus selected, is applied to AND gate 50 via line 55 and is gated in AND gate 50 with the clock-pulses applied previously by clock oscillator 41. The output of AND gate 50 is applied to scaler 45.

The operation according to the construction of the gate circuit shown in FIG. 4 is explained using the timing chart given in FIG. 5. Clock-pulses are continuously oscillated at arbitrary phase and time signals with artibrary phase relation are applied thereto. Then, the clock-pulses are triggered at a phase 62 of the leading edge portion by synchronizing FF 46 and the output of synchronizing FF 46 is generated at a phase 63 (according to the type of IC the trigger varies but the pulses are, in general, triggered at the leading edge portion when IC of emitter coupled logic [ECL] is used). The output of the synchronizing FF 46 is delayed as shown at phase 63 from phase 62 due to delay in propergation of IC to the phase of the clock-pulses. The output from synchronizing FF 46 is shifted at every cycle of the clock-pulses and is given at a phase 64 on line 51 as output 1 and at a phase 65 on line 52 as output 2, phase 64 being offset with phase 63. One of the output 1 and the output 2 is alternately selected by the control signal from phase control circuit 48 in selecting gate 49 to be applied to AND gate 50 to control the clockpulses and to provide a pulse train at the output terminal of AND gate 50 as shown by phase 1 and phase 2. As is illustrated in the figure, the output from AND gate 50 at the phase 1 is offset with the output from AND gate 50 at the phase 2 by one period of the clockpulses and, accordingly, the outputs of the first stage binary $2^0$ of scaler 45 which are triggered by the pulse train operate with offset by one period.

The operation above explained is related to the time when the gate opens. When the gate closes, the same operation as the time when the gate opens is effected and an operation with one period offset of the clock-pulses is alternately, each cycle, effects under the control of those control circuit 48 with the time signals.

The interference operation against the clockpulses etc. due to the operation of the scaler is effected during the operation of the scaler and the interference operation appears in the form of unbalance at the time when the gate closes.

In FIG. 5, when the ouput of AND gate 50 is operating at the phase 1, it is necessary that a phase 85 of the trailing edge portion of the time signal is between a time 68 and a time 69 in order for scaler 45 to stop at the tenth count. Then, the operation of the phase 1 of $2^0$ order of scaler 45 is changing from plus to minus as shown by a waveform 82 and this affects the clock-pulses to vary the period.

At the next cycle, the output of AND gate 50 is operating at the phase 2 and the phase relationship at a phase 86 when synchronizing FF 46 is closed is contrary to the phase relationship at waveform 82 as shown in that the output of the phase 2 of $2^0$ order of scaler 45 is given at a waveform 83 to make the affect to the cycle of the clock pulses reverse.

As stated above, the interference operation in one cycle is left uncompensated, but as the alternate interfere operation operate with a reversed phase relationship, when the clock-pulses are used in an analyzer to obtain the final resultant output in summarizing the result of measurements as in a histogram, an averaging operation is effected in the summarizing process to eliminate the affect of unbalance viewing from the whole measurement in the histogram.

In the gate circuit of FIG. 5, the pulse train to scaler 45 is to be closed at a phase 70 or at a phase 71 of the output of selecting gate 49 and, therefore, the operation in the phase or the interfere operation seems to be issues. However, as the operation suceeding synchronizing FF 46 is a complete logic operation of the cycle of the clock-pulses, the effects at phase 70 and phase 71 do fundamentally not occur.

In explaining the above circuit construction, a two-stage shift scaler is used specially in considering the affect of $2^0$ order of the scaler. However, it is necessary to make the operation average in a wide range by using four or eight-stage shift scaler in order to have the operation completely averaged, because the affect of the $2^1$ order or the $2^2$ order is recognized.

Figure 6:
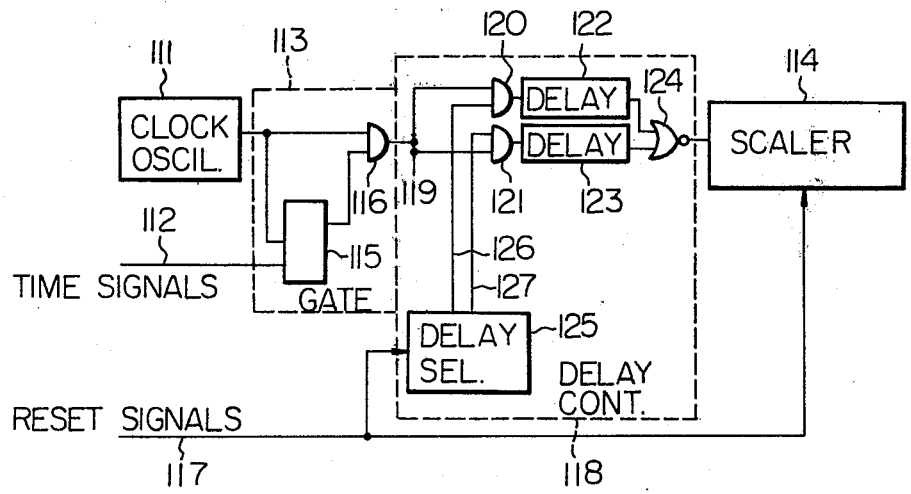
FIG. 6 is a block diagram showing another embodiment of the counting process of this invention.

The counting process of this invention is further explained as an extensive example in FIG. 6 in the following manner:

In another embodiment of the counting process of this invention shown in FIG. 6, a clock oscillator 111, a gate circuit 113 and a scaler 114 are arranged similar to the counting process of this invention shown in FIG. 4. Gate circuit 113 is comprised of a synchronizing circuit 115 and an AND gate 116 and the output from gate circuit 113 is connected to a delay control circuit 118. Delay control circuit 118 is comprised of selecting gates 120 and 121, each connected to the output from AND gate 116, delay elements 122 and 123, each connecting selecting gates 120 and 121 to an OR gate 124 and a delay selecting circuit 125 having an input terminal connected to reset signals given at a terminal 117. The outputs from delay selecting circuit 125 are connected to selecting gates 120 and 121 through lines 126 and 127, respectively. Delay elements 122 and 123 have difference in time delay of one period of the clock-pulses. In the embodiment shown in FIG. 6, two kinds of delays are given to the pulse train which is obtained in gate circuit 113.

The operation of the circuit shown in FIG. 6 is explained as follows: Time signals are applied to a terminal 112 and are synchronized with the clock-pulses applied from clock oscillator 111 by means of synchronizing circuit 115. The clock-pulses are gated by AND gate 116 to provide pulse trains at a terminal 119. In delay control circuit 118, the pulse trains coming from terminal 119 are divided into two, one through selecting gate 120 and delay element 122 and the other through selecting gate 121 and delay element 123, and summed at an OR gate 124 to be sent to channel scaler 114. Selecting control of the two delay circuits is effected in that the reset pulses provided at the beginning or at the ending each cycle are applied from terminal 117 to control delay selecting circuit 125 and effective signals alternately are provided at output terminals 126 and 127 to control selecting gates 120 and 121.

Delay elements 122 and 123 have a difference in time delay of one period of the clock-pulses between them, such as zero time delay for delay element 122 and one period time delay for delay element 123.

Figure 7:
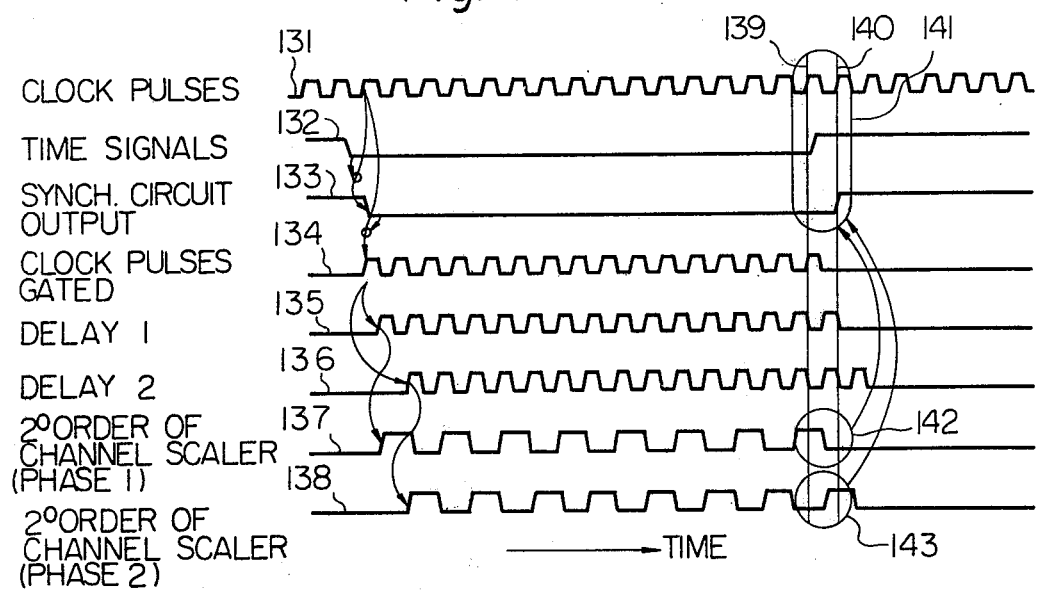
FIG. 7 shows the waveforms showing the operation of the circuit shown in FIG. 6.

The waveforms are explained in FIG. 7. Time signals 132 synchronize with clock-pulses 131 to be an output 133 from a synchronizing circuit and gate the clock-pulses to provide a pulse train 134. Pulse train 134 passes through delay element 122 at one cycle and delays slightly as shown by delay 1 which is expressed by 135 by the delay time for propagation of the circuit that the pulse train passes through and also passes through delay element 123 at the next cycle and delays as shown by delay 2 which is expressed by 136 by one period of the clock pulses surplus to the delay 1. As scaler 114 operates alternately by the delayed pulse train, the waveform of the operation in the $2^0$ order of one cycle is expressed as a waveform 137 and the waveform of the operation in the order of the next cycle is expressed as a waveform 138, thus the waveforms are repeated alternately. In FIG. 7, the time signals are shown as of the same in the two cycles, but the time signal may be arbitrary each cycle.

As explained above, when the operating phase of the $2^0$ order in the scaler is reversed each cycle, the operations of interference to the clock oscillator, the gate circuits etc. are also alternately reversed to provide the distortions in the clock-pulses alternately and average statistically the distortions.

It is an important point as the actions of interference in the gate circuits at which phase the synchronizing circuit operates. The phase is given at phase 141 which has a period from time 139 to time 140. The phase of the scaler which interferes with phase 141 is phase 142 at one cycle and is phase 143 at the next cycle to provide a reversed phase alternation. Accordingly, the operations of interference are provided alternately and an averaging operation can be expected against the unbalance. Thus, the unbalance is statistically averaged and the differential non-linearity is improved.

It is naturally noticed that the counting process of this invention is not limited to the construction shown in the embodiments of FIG. 6. For example, the number of stages of the delay elements may be 4 or 8 instead 2 as shown in the figures. If the two-stage delay elements are used, the odd-even unbalance due to an action of interference from the $2^0$ order of the scaler is improved. If the four- or eight-stage delay elements are used, the unbalance of four-channels or eight-channels cycle due to action of interferences from the $2^1$ order or the $2^2$ order is improved.

A piece of coaxial cable sliced to have one cycle unit of the clock-pulses may be used as the delay element and any other element can be used therefor.

The construction of the delay control gate is also arbitrary. FIG. 6, the clock pulses are divided into two parts by the selecting signal to be applied to separate delay element.

Figure 8:
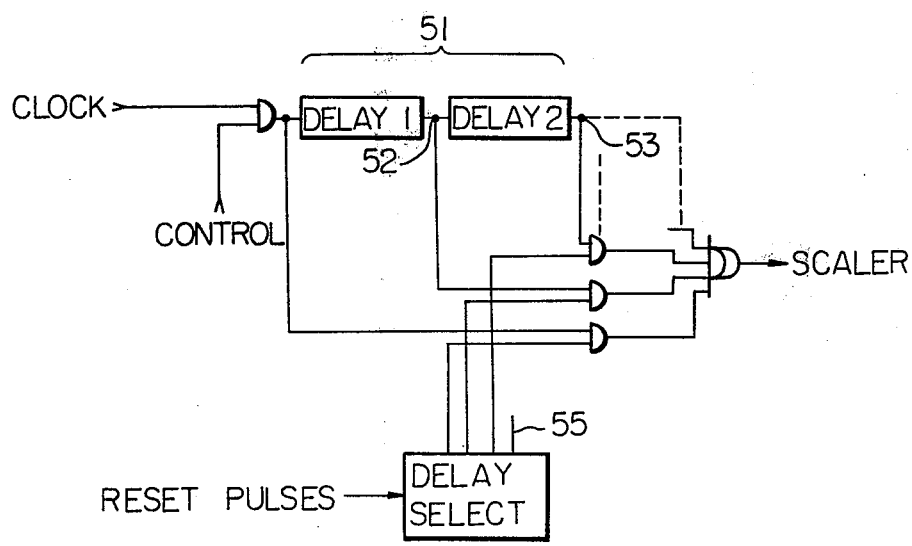
FIG. 8 is a block diagram showing a further embodiment of the counting process of this invention.

As shown in FIG. 8, the clock-pulses may be applied to a delay element 151 and a predetermined delay pulse is taken out from points 152, 153 etc. which are at the junction of the delay elements to be selected thereafter in accordance with the output from a delay selecting circuit 155.

It is necessary that the delay selecting circuit is provided with control signals the same as the delay stages and the order for switching the delay elements is, in general, continuous but it may be random.

As explained in the above, the time signals are shifted with synchronizing with the clock-pulses and the shift steps are varied at each measuring cycles and, therefore, the interfering operation of a specialized value of the scaler is dispersed when the main gate closes and the unbalance with regularity such as the odd-even unbalance is eliminated to improve the differential nonlinearity. Since the differential nonlinearity is improved as stated above, it is not necessary to limit the clock rate in this invention and the clock rate can be raised to the marginal speed of the elements. As the differential nonlinearity is improved as stated above, the gate circuits of this invention can maintain a better differential nonlinearity than that of the prior circuit and a high speed ADC with high accuracy is obtained.

Elements constructing the synchronizing circuit, the shift scaler and the delay elements are not limited to the types those used in the preferred embodiments. The ICs and the flip-flops of the J K type made for used as shift registers can be used as the elements for the shift registers of this invention. The number of shift in the shift scaler can be determined by a binary scaler and the shift scaler is not limited to a shift type scaler. The number of the shift scaler may be four or eight and, of course, more over in addition to the two stages shown in the embodiment and the number of the shift scaler is determined to make the unbalance phenomena average in accordance with the period that the unbalance phenomena represents. The number of the stages of the control scaler naturally increases by the number corresponding to the number of the shift scaler as the number of the shift scaler increases.

The order and the period of switching the outputs from the shift scaler are naturally alternative at two stages and at four stages or eight stages it is not necessary to switch the outputs in the order which begins sequentially from the small order or the large order but in an arbitrary order including random number. Under this condition, it is only necessary to switch the outputs so that every stage is evenly used. For example, it is necessary to maintain that when two stages are used, each stage is gated averagely by 50% probability and when four stages are used, each stage is gated averagely by 25% probability. The period changes, in general, at each cycle but it is not necessary to limit the change at each cycle but the period may change at two cycles, at three cycles etc. at an arbitrary cycles. It is only necessary to maintain a condition where the ratio of every stages becomes the same probability in a measuring time.

What is claimed as new and desired to be secured by letters patent of the United States is:

1. In a time-to-digital circuit, an apparatus for counting a pulse train obtained by gating clock-pulses by means of time signals to obtain digital values comprising:
   a synchronizing circuit connected to a terminal of time signals for synchronizing the phases of said clock-pulses with the phases of said time signals,
   a shift scaling circuit having a plurality of stages, including a binary coded unit, connected to the synchronizing circuit for shifting the time signals applied to the shift scaling circuit in accordance with the period of the clock pulses to obtain outputs from every stage of the shift scaling circuit,
   a control scaling circuit having the same number of ordered outputs as the number of outputs of said shift scaling circuit and connected to a terminal of reset signals,
   a plurality of selecting gates, each selecting gate having the same number of stages as those in the shift scaling circuit and connected to the shift scaling circuit and the control scaling circuit for applying one of the outputs obtained from the stages of the shift scaling circuit to the selecting gate to select a time signal by an ordered output signal of the control scaling circuit, said ordered output signal being provided by the control scaling circuit through being advanced every converting cycle, and
   AND gate means connected to the selecting circuit for directly controlling the clock-pulses and for obtaining a pulse train with a number proportional to the number of the period of the time signals by gating the clock-pulses by the AND gate by means of the synchronized, shifted and selected time signals.

2. In a time-to-digital circuit, an apparatus for counting a pulse train obtained by gating clock pulses by means of time signals to obtain digital values comprising:
   a continuously oscillating clock oscillator,
   an AND gate connected to the clock oscillator for gating clock pulses from the clock oscillator by means of time signals to obtain a pulse train,
   a shift scaling circuit for counting the pulse train obtained by the gating process in the AND gate, and
   a delay control circuit connected between the AND gate and the shift scaling circuit, said delay control circuit including a plurality of selecting gates, a plurality of delay elements each connected to a respective selecting gate and having a difference in time delay of one period of the clock pulses, a plurality of OR gates each connected to a respective delay element, and a delay selecting circuit connected to the selecting gates,
   whereby the delay selecting circuit applies the pulse train that is gated by the AND gate to a respective one of said delay elements through a respective one of the selecting gates at each measuring cycle to select and control the respective one of the delay elements in an arbitrary order.

* * * * *